United States Patent
Tu et al.

(10) Patent No.: US 7,924,260 B2
(45) Date of Patent: Apr. 12, 2011

(54) SHIFT REGISTER, GATE DRIVING CIRCUIT WITH BI-DIRECTIONAL TRANSMISSION FUNCTION, AND LCD WITH DOUBLE FRAME RATE

(75) Inventors: Ming-Hung Tu, Hsin-Chu (TW); Chih-Hsiang Yang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 697 days.

(21) Appl. No.: 12/030,196

(22) Filed: Feb. 12, 2008

(65) Prior Publication Data
US 2009/0102778 A1   Apr. 23, 2009

(30) Foreign Application Priority Data
Oct. 19, 2007   (TW) ................................ 96139278 A

(51) Int. Cl.
*G09G 3/36* (2006.01)

(52) U.S. Cl. .............. 345/100; 377/64; 377/67; 377/78; 377/81

(58) Field of Classification Search ........................ None
See application file for complete search history.

(56) References Cited

U.S. PATENT DOCUMENTS
5,363,424 A * 11/1994 Fujisawa ........................ 377/69
6,813,331 B1 * 11/2004 Yu et al. ......................... 377/69
* cited by examiner

*Primary Examiner* — Richard Hjerpe
*Assistant Examiner* — Carolyn R Edwards
(74) *Attorney, Agent, or Firm* — Winston Hsu; Scott Margo

(57) ABSTRACT

A shift register applied on a double-frame-rate LCD is provided. The LCD includes an upper display area with c gate lines, a lower display area with d gate lines, and a gate driving circuit. The gate driving circuit includes a first shift register coupled to the corresponding x gate lines of the upper display area, a second shift register coupled to the corresponding y lines of the lower display area, and a third shift register coupled to the corresponding (c-x) gate lines of the upper display area and the corresponding (d-y) gate lines of the lower display area.

10 Claims, 15 Drawing Sheets

(Down scanning, U/D=1, SE=1)

(Down scanning, U/D=1, SE=0)

(Up scanning, U/D=0, SE=1)

SHIFT REGISTER, GATE DRIVING CIRCUIT WITH BI-DIRECTIONAL TRANSMISSION FUNCTION, AND LCD WITH DOUBLE FRAME RATE

BACKGROUND OF THE INVENTION

1. Field of the Invention

The present invention provides a shift register and a gate driving circuit composed of the shift registers, and more particularly, to an LCD with double frame rate utilizing the provided shift register.

2. Description of the Prior Art

FIG. 1 is a diagram illustrating a conventional LCD with double frame rate (120 Hz). As shown in FIG. 1, the LCD 100 comprises a gate driving circuit 110, two data driving circuits 121 and 122, and a display area 130. The display area 130 comprises an upper display area 131 and a lower display area 132. The data driving circuit 121 is disposed at the upper end of the display area 130 for transmitting corresponding frame data to the upper display area 131 through data lines $D_1$, $D_2$, and so on. The data driving circuit 122 is disposed at the lower end of the display area 130 for transmitting corresponding frame data to the lower display area 132 through data lines $D_1'$, $D_2'$, and so on. Each of the upper and the lower display areas 131 and 132 comprises a plurality of gate lines ($G_1$~$G_{1080}$), a plurality of data lines, and a plurality of pixels P. The plurality of pixels P are interwoven by the plurality of gate lines and the plurality of data lines. Each pixel P comprises a thin film transistor (TFT) SW, a pixel capacitor $C_{ST}$, and a corresponding liquid crystal particle $C_{LC}$. The gate of the TFT SW is coupled to a corresponding gate line, the source of the TFT SW is coupled to a corresponding data line, and the drain of the TFT SW is coupled to the corresponding pixel capacitor $C_{ST}$ and the corresponding liquid crystal particle $C_{LC}$.

The gate driving circuit 110 comprises four gate drivers 111~114. For example, the amount of the total gate lines of the LCD 100 may be 1080, and consequently the gate driver 111 corresponding to the upper display area 131 comprises gate lines $G_1$~$G_{270}$, the gate driver 112 corresponding to the upper display area 131 comprises gate lines $G_{271}$~$G_{540}$, the gate driver 113 corresponding to the lower display area 132 comprises gate lines $G_{541}$~$G_{810}$, the gate driver 114 corresponding to the lower display area 132 comprises gate lines $G_{811}$~$G_{1080}$. The gate driving circuit 110 is disposed for receiving down-scanning enabling signal $I_D$ and transmitting gate driving signals $S_1$, $S_2$ ... $S_{540}$ and $S_{541}$, $S_{542}$ ... $S_{1080}$ from top to bottom, or, for receiving up-scanning enabling signal $I_U$ and transmitting gate driving signals $S_{540}$, $S_{539}$ ... $S_1$ and $S_{1080}$, $S_{1079}$ ... $S_{541}$ from bottom to top.

FIG. 2 is a timing diagram illustrating when the gate driving circuit 110 in FIG. 1 receives the down-scanning enabling signal $I_D$. As shown in FIG. 2, when the gate driver 111 receives the down-scanning enabling signal $I_D$, the gate driving signals $S_1$~$S_{270}$ are sequentially generated, and then the gate driving signal $S_{270}$ is transmitted to the gate driver 112 to activate the gate driver 112 to generate the gate driving signals $S_{271}$~$S_{540}$. Meanwhile, the gate driver 113 also receives the down-scanning enabling signal $I_D$, and the gate driving signals $S_{541}$~$S_{810}$ are generated, and then the gate driving signal $S_{540}$ is transmitted to the gate driver 114 to activate the gate driver 114 to generate the gate driving signals $S_{811}$~$S_{1080}$. In this way, the scanning processes of the upper and the lower display areas 131 and 132 are completed so as to display a frame completely.

FIG. 3 is a timing diagram illustrating when the gate driving circuit 110 in FIG. 1 receives the up-scanning enabling signal $I_U$. As shown in FIG. 3, when the gate driver 112 receives the up-scanning enabling signal $I_U$, the gate driving signals $S_{540}$~$S_{271}$ are sequentially generated, and then the gate driving signal $S_{271}$ is transmitted to the gate driver 111 to activate the gate driver 111 to generate the gate driving signals $S_{270}$~$S_1$. Meanwhile, the gate driver 114 also receives the up-scanning enabling signal $I_U$, and the gate driving signals $S_{1080}$~$S_{811}$ are generated, and then the gate driving signal $S_{811}$ is transmitted to the gate driver 113 to activate the gate driver 113 to generate the gate driving signals $S_{810}$~$S_{540}$. In this way, the scanning processes of the upper and the lower display areas 131 and 132 are completed so as to display a frame completely.

Therefore, at the frame rate of 120 Hz, the upper display area 131 can generate gate driving signals with the gate drivers 111 and 112, and the lower display area 132 can generate gate driving signals with the gate drivers 113 and 114. In this way, the LCD 100 is driven completely. The amount of the gate drivers which each display area needs is 2N (N: integer). The drawback of the conventional LCD 100 is that the amount of the gate drivers cannot be reduced, which increases costs and lowers the yielding rate of the LCD.

SUMMARY OF THE INVENTION

The present invention provides a shift register. The shift register comprises a first transmission end for receiving a down-scanning enabling signal, a second transmission end for receiving the down-scanning enabling signal or an up-scanning enabling signal, a third transmission end for receiving the up-scanning enabling signal, a first switch comprising a first end coupled to the first transmission end, a control end for receiving a direction signal indicating the up-scanning or the down-scanning enabling signal is received, and a second end for coupling to the first end of the first switch according to the direction signal, a first shift register module having m shift register units comprising, a first shift register unit comprising a first input end coupled to the second end of the first switch, a second input end for receiving a clock signal, and an output end for outputting a first driving signal according to the signals on the first input end and the second input end of the first shift register unit, a $p^{th}$ shift register unit comprising, a first input end coupled to an output end of a $(p-1)$th shift register unit, a second input end for receiving the clock signal, and an output end for outputting a $p^{th}$ driving signal according to the signals on the first input end and the second input end of the $p^{th}$ shift register unit, and an $m^{th}$ shift register unit comprising a first input end coupled to an output end of an $(m-1)^{th}$ shift register unit, a second input end for receiving the clock signal, and an output end for outputting an $m^{th}$ driving signal according to the signals on the first input end and the second input end of the $m^{th}$ shift register unit, a second switch comprising, a first end coupled to the output end of the $m^{th}$ shift register unit, a control end for receiving a selection signal, and a second end for coupling to the first end of the second switch according to the selection signal, a second shift register module having n shift register units comprising a second shift register unit comprising a first input end coupled to the second end of the first switch, a second input end for receiving the clock signal, and an output end for outputting a second driving signal according to the signals on the first input end and the second input end of the second shift register unit, a $q^{th}$ shift register unit comprising a first input end coupled to an output end of a $(q-1)^{th}$ shift register unit, a second input end for receiving the clock signal, and an output end for outputting a $q^{th}$ driving signal according to the signals on the first input end and the second input end of the $q^{th}$ shift register unit, and a $n^{th}$ shift register unit comprising a first input end coupled to an output end of an $(n-1)^{th}$ shift register unit, a second input end for receiving the clock signal, and an output end for outputting an $n^{th}$ driving signal according to the signals on the first input end and the second input end of the $n^{th}$ shift register unit, a third switch comprising a first end coupled to the output end of the $n^{th}$ shift register, a control end for receiving the direction signal, and a second end coupled to the third transmission end of the shift register for coupling to the first end of the third switch according to the direction signal, a fourth switch comprising a first end coupled to the output end of the $n^{th}$ shift register unit, a control end for an inversion of the direction signal, and a second end coupled to the first transmission end of the shift register for coupling to the first end of the fourth switch according to the inversion of the direction signal, a fifth switch comprising a first end coupled to the second transmission end of the shift register, a control end for receiving the inversion of the direction signal, and a second end coupled to the first input end of the second shift register unit for coupling to the first end of the fifth switch according to the inversion of the direction signal, a sixth switch comprising a first end coupled to the output end of the nth shift register unit, a control end for receiving the inversion of the direction signal, and a second end coupled to the first input end of the first shift register unit for coupling to the first end of the sixth switch according to the inversion of the direction signal, wherein m, n, p, q are integers greater than 1 and 1<p<m, and 1<q<n.

The present invention further provides a gate driving circuit with bi-directional transmission function. The gate driving circuit comprises a shift register comprising a first transmission end for receiving a down-scanning enabling signal, a second transmission end for receiving the down-scanning enabling signal or an up-scanning enabling signal, a third transmission end for receiving the up-scanning enabling signal, a first switch comprising a first end coupled to the first transmission end, a control end for receiving a direction signal indicating the up-scanning or the down-scanning enabling signal is received, and a second end for coupling to the first end of the first switch according to the direction signal, a first shift register module having m shift register units comprising a first shift register unit comprising a first input end coupled to the second end of the first switch, a second input end for receiving a clock signal, and an output end for outputting a first driving signal according to the signals on the first input end and the second input end of the first shift register unit, a $p^{th}$ shift register unit comprising a first input end coupled to an output end of a $(p-1)^{th}$ shift register unit, a second input end for receiving the clock signal, and an output end for outputting a $p^{th}$ driving signal according to the signals on the first input end and the second input end of the $p^{th}$ shift register unit, and an $m^{th}$ shift register unit comprising a first input end coupled to an output end of an $(m-1)^{th}$ shift register unit, a second input end for receiving the clock signal, and an output end for outputting an $m^{th}$ driving signal according to the signals on the first input end and the second input end of the $m^{th}$ shift register unit, a second switch comprising a first end coupled to the output end of the $m^{th}$ shift register unit, a control end for receiving a selection signal, and a second end for coupling to the first end of the second switch according to the selection signal, a second shift register module having n shift register units comprising a second shift register unit comprising a first input end coupled to the second end of the first switch, a second input end for receiving the clock signal, and an output end for outputting a second driving signal according to the signals on the first input end and the second input end of the second shift register unit, a $q^{th}$ shift register unit comprising a first input end coupled to an output end of a $(q-1)^{th}$ shift register unit, a second input end for receiving the clock signal, and an output end for outputting a $q^{th}$ driving signal according to the signals on the first input end and the second input end of the $q^{th}$ shift register unit, and an $n^{th}$ shift register unit comprising a first input end coupled to an output end of an $(n-1)^{th}$ shift register unit, a second input end for receiving the clock signal, and an output end for outputting an $n^{th}$ driving signal according to the signals on the first input end and the second input end of the nth shift register unit, a third switch comprising a first end coupled to the output end of the nth shift register, a control end for receiving the direction signal, and a second end coupled to the third transmission end of the shift register for coupling to the first end of the third switch according to the direction signal, a fourth switch comprising a first end coupled to the output end of the nth shift register unit, a control end for receiving inversion of the direction signal, and a second end coupled to the first transmission end of the shift register for coupling to the first end of the fourth switch according to the inversion of the direction signal, a fifth switch comprising a first end coupled to the second transmission end of the shift register, a control end for receiving the inversion of the direction signal, and a second end coupled to the first input end of the second shift register unit for coupling to the first end of the fifth switch according to the inversion of the direction signal, a sixth switch comprising a first end coupled to the output end of the nth shift register unit, a control end for receiving the inversion of the direction signal, and a second end coupled to the first input end of the first shift register unit for coupling to the first end of the sixth switch according to the inversion of the direction signal, and a data selection circuit coupled to the shift register for selectively and sequentially generating a plurality of gate driving signals according to driving signals generated by the shift register and the up-scanning enabling signal or the down-scanning enabling signal, wherein m, n, p, q are integers greater than 1 and 1<p<m, and 1<q<n.

The present invention further provides an LCD with double frame rate. The LCD comprises an upper display area comprising c gate lines, a lower display area comprising d gate lines, a gate driving circuit comprising a first shift register coupled to corresponding x lines of the upper display area for providing corresponding gate driving signals, a second shift register coupled to corresponding y lines of the lower display area for providing corresponding gate driving signals, and a third shift register coupled to corresponding (c-x) lines of the upper display area and corresponding (d-y) lines of the lower display area for providing corresponding gate driving signals, wherein c, d, x, y are integers greater than 1, and 1<x<c, and 1<y<d.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
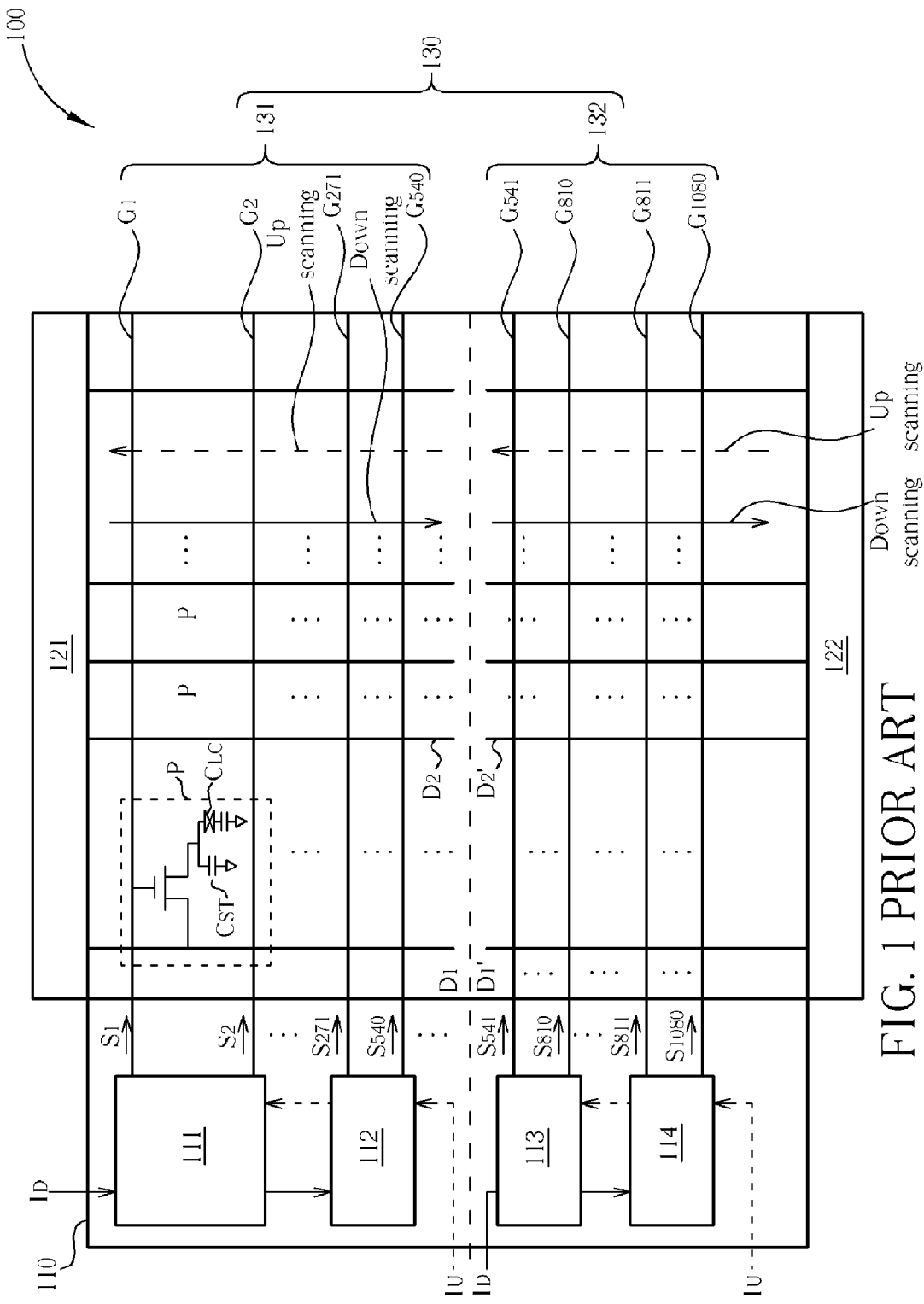
FIG. 1 is a diagram illustrating a conventional LCD with double frame rate.
Figure 2:
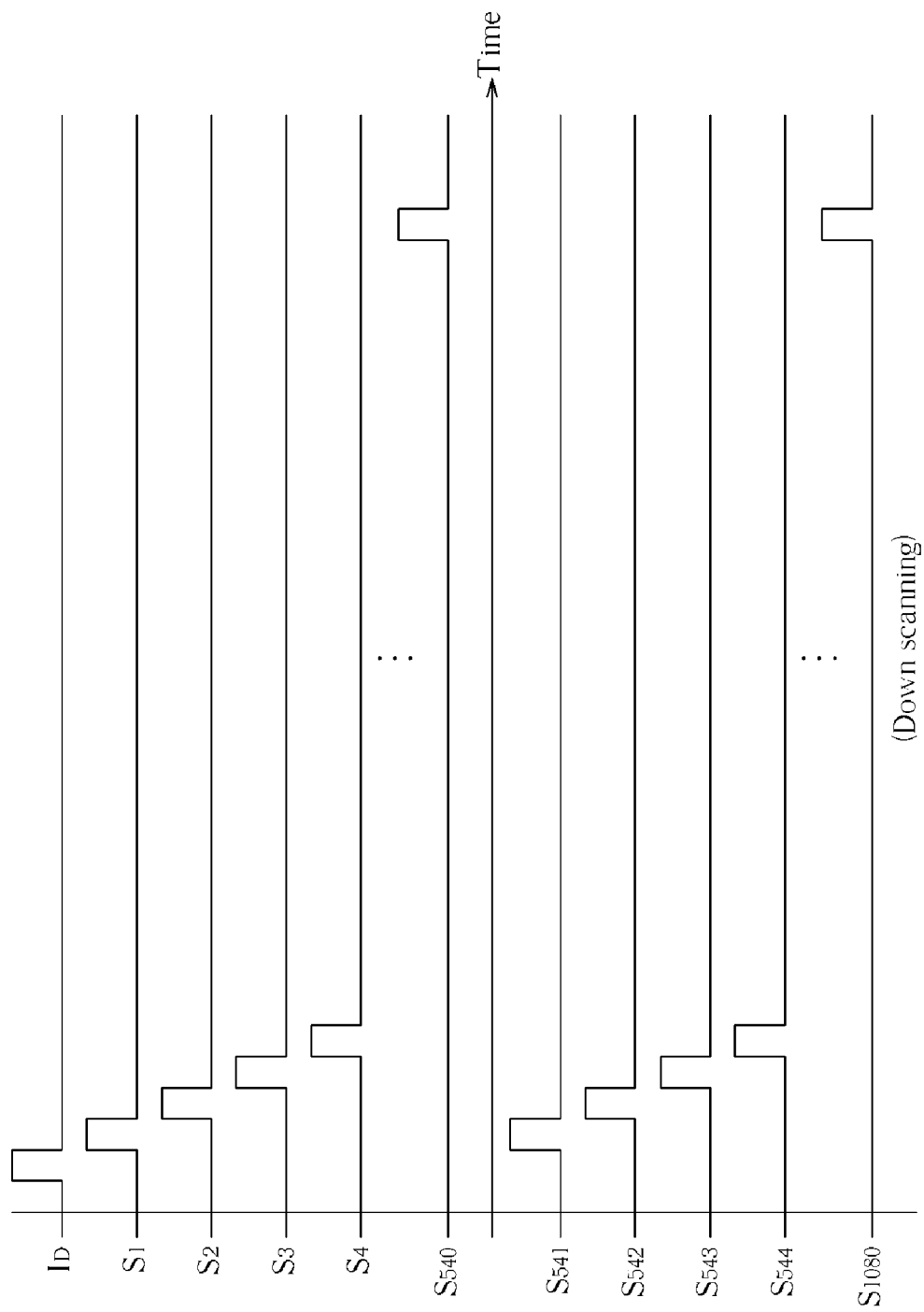
FIG. 2 is a timing diagram illustrating when the gate driving circuit in FIG. 1 receives the down-scanning enabling signal.
Figure 3:
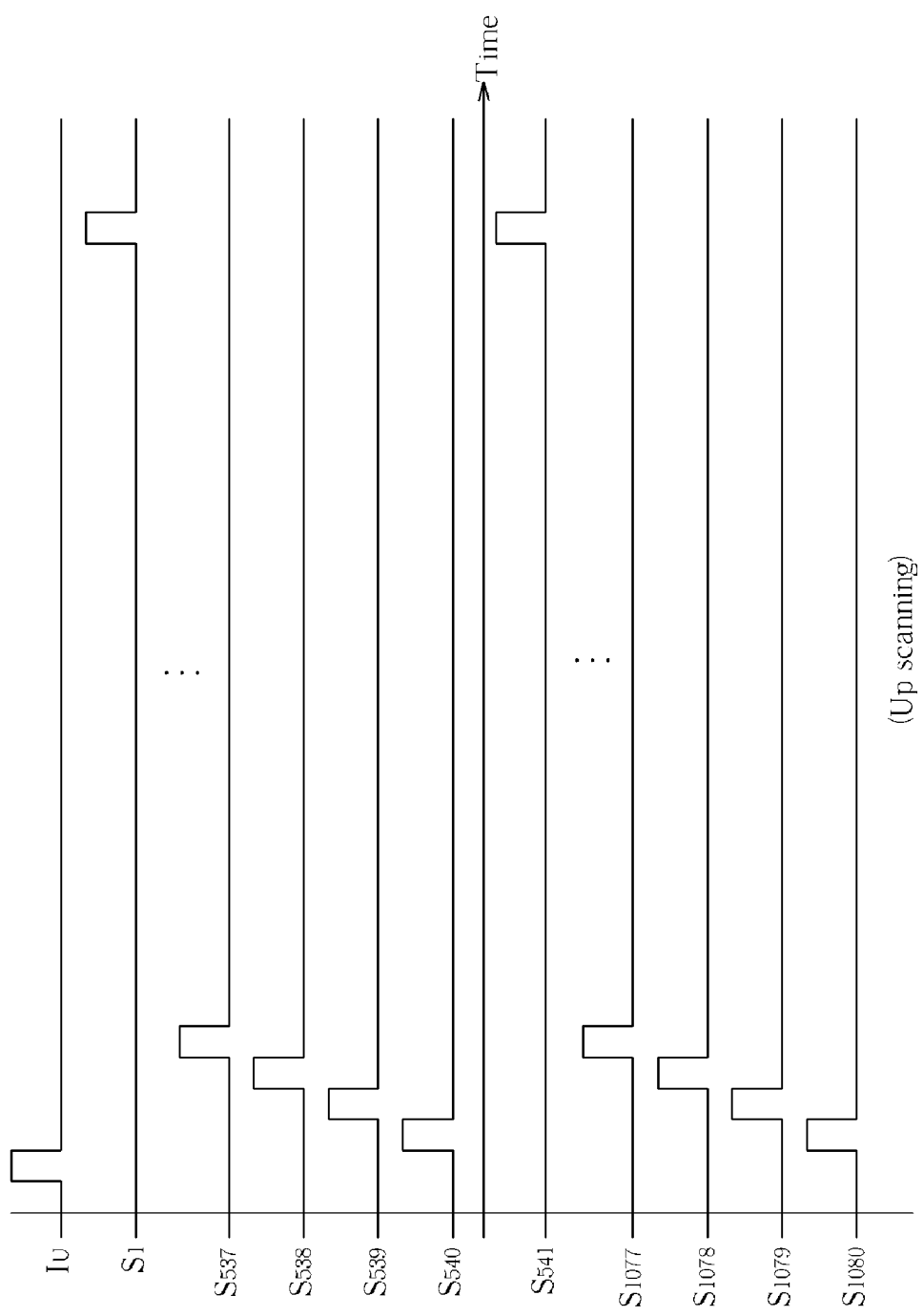
FIG. 3 is a timing diagram illustrating when the gate driving circuit in FIG. 1 receives the up-scanning enabling signal.
Figure 4:
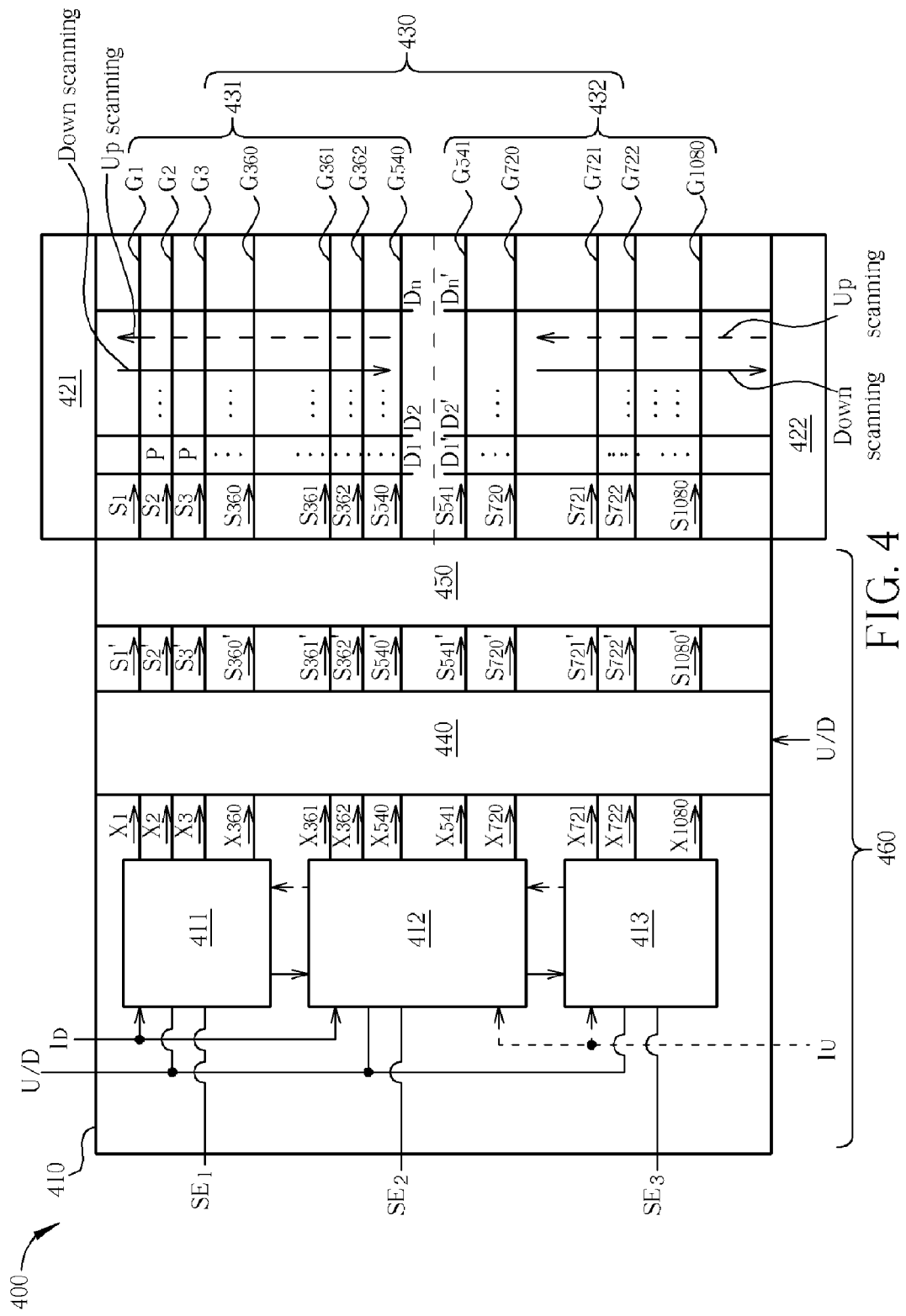
FIG. 4 is a diagram illustrating an LCD with double frame rate of the present invention.

FIG. 4 is a diagram illustrating an LCD 400 with double frame rate of the present invention. As shown in FIG. 4, the LCD 400 comprises shift register driving circuit 410, signal selection circuit 440, voltage shift circuit 450, data driving circuits 421 and 422, and a display area 430. As shown in FIG. 4, the gate driving circuit 460 with bi-direction is composed of the shift register driving circuit 410, the signal selection circuit 440, and the voltage shift circuit 450. The display area 430 comprises an upper display area 431 and a lower display area 432. The data driving circuit 421 is disposed at the upper end of the display area 430 for transmitting corresponding frame data to the upper display area 431 through data lines $D_1$, $D_2$, and so on. The data driving circuit 422 is disposed at the lower end of the display area 430 for transmitting corresponding frame data to the lower display area 432 through data lines $D_1'$, $D_2'$, and so on.

Each of the upper and the lower display areas 431 and 432 comprises a plurality of gate lines, a plurality of data lines, and a plurality of pixels P. The plurality of pixels P are interwoven by the plurality of gate lines and the plurality of data lines. Each pixel P comprises a Thin Film Transistor (TFT) SW, a pixel capacitor $C_{ST}$, and a corresponding liquid crystal particle $C_{LC}$. The gate of the TFT SW is coupled to a corresponding gate line, the source of the TFT SW is coupled to a corresponding data line, and the drain of the TFT SW is coupled to the corresponding pixel capacitor $C_{ST}$ and the corresponding liquid crystal particle $C_{LC}$. The shift register driving circuit 410 comprises three shift registers 411~413. For example, the amount of the total gate lines of the LCD 400 may be 1080, and consequently each of the shift register 411~413 comprises 360 driving lines. As shown in FIG. 4, the shift register 411 comprises driving signals $X_1$~$X_{360}$, the shift register 412 comprises driving signals $X_{361}$~$X_{720}$, and the shift register 413 comprises driving signals $X_{721}$~$X_{1080}$. The shift register driving circuit 410 receives the down-scanning enabling signal $I_D$ or the up-scanning enabling signal $I_U$, the direction signal U/D, and the selection signals $SE_1$, $SE_2$ and $SE_3$, and the shift register driving circuit 410 transmits the driving signals $X_1$~$X_{1080}$ according to the received signals. The direction signal U/D indicates the shift register driving circuit 410 is receiving the up-scanning enabling signal $I_U$ or the down-scanning enabling signal $I_D$. The signal selection circuit 440 receives the direction signal U/D and the driving signal $X_1$~$X_{1080}$, and accordingly sequentially transmits driving signals $S_1'$~$S_{540}'$ and $S_{541}'$~$S_{1080}'$ when in the down-scanning state or $S_{1080}'$~$S_{541}'$ and $S_{540}'$~$S_1'$ when in the up-scanning state. The voltage shift circuit 450 shifts the voltages of the driving signals $S_1'$~$S_{1080}'$ to be the gate driving signals $S_1$~$S_{1080}$ and transmits the gate driving signals $S_1$~$S_{1080}$ to the display area 430 for display.

Figure 5:
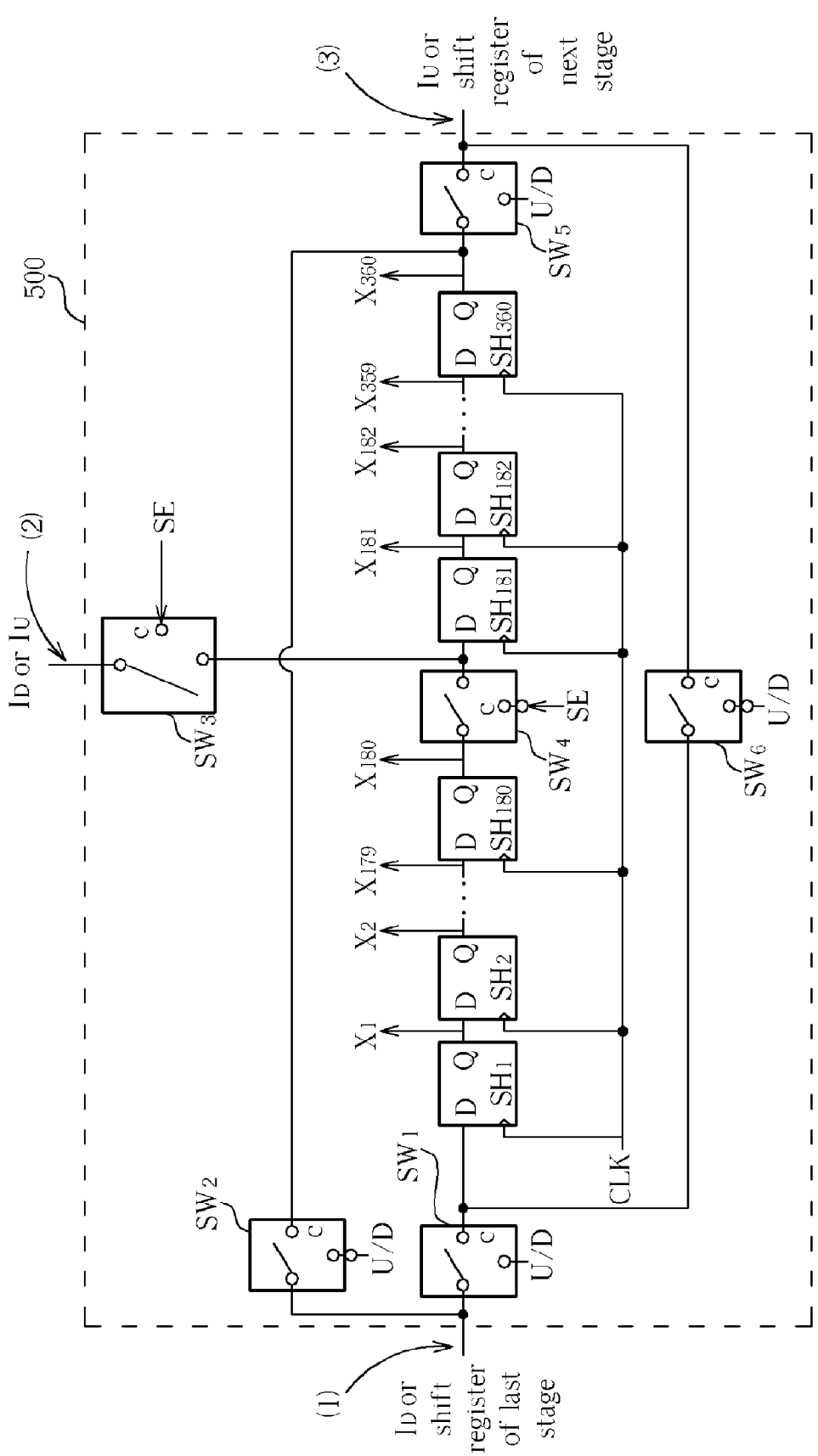
FIG. 5 is a diagram illustrating the shift register of the present invention.

FIG. 5 is a diagram illustrating the shift register of the present invention. The shift register 500 can be utilized in the shift registers 411~413 of the shift register driving circuit 410 of the present invention. As shown in FIG. 5, the shift register 500 comprises three transmission ends 1, 2, and 3, six switches $SW_1$~$SW_6$, and shift register units $SH_1$~$SH_{360}$. Each of the shift register units $SH_1$~$SH_{360}$ comprises a first input end, a second input end, and an output end. The second input end of each shift register unit is disposed for receiving a clock signal CLK. Each of the shift register units is disposed for receiving the signal on the first input end, delaying the received signal for a predetermined period of time according to the clock signal CLK, and then outputting the delayed signal on the output end as a driving signal X. For example, the driving signal $X_2$ is generated by delaying the driving signal $X_1$ for a period of the clock signal CLK, and the driving signal $X_3$ is generated by delaying the driving signal $X_2$ for a period of the clock signal CLK, and so on.

The switch $SW_1$ is coupled between the transmission end 1 and the first input end of the shift register unit $SH_1$. The control end C of the switch $SW_1$ receives the direction signal U/D to control the coupling between the transmission end 1 and the shift register unit $SH_1$. The switch $SW_2$ is coupled between the transmission end 1 and the output end of the shift register unit $SH_{360}$. The control end C of the switch $SW_2$ receives the inversion of the direction signal U/D to control the coupling between the transmission end 1 and the output end of the shift register $SH_{360}$. One end of the switch $SW_3$ is coupled to the first input end of the shift register $SH_{181}$, and the other end of the switch $SW_3$ receives the up-scanning enabling signal $I_U$ or the down-scanning enabling signal $I_D$. The control end C of the switch $SW_3$ receives the inversion of the selection signal SE to control the transmission of the up-scanning enabling signal $I_U$ or the down-scanning enabling signal $I_D$ to the first input end of the shift register unit $SH_{181}$.

The switch $SW_4$ is coupled between the output end of the shift register unit $SH_{180}$ and the first input end of the shift register unit $SH_{181}$. The control end C of the switch $SW_4$ receives the selection signal SE to control the coupling between the output end of the shift register unit $SH_{180}$ and the first input end of the shift register unit $SH_{181}$. The switch $SW_5$ is coupled between the output end of the shift register unit $SH_{360}$ and the transmission end 3. The control end C of the switch $SW_5$ receives the direction signal U/D to control the coupling between the output end of the shift register unit $SH_{360}$ and the transmission end 3. The switch $SW_6$ is coupled between the transmission ends 1 and 3. The control end C of the switch $SW_6$ receives the inversion of the direction signal U/D to control the coupling between the transmission ends 1 and 3.

Figure 6:
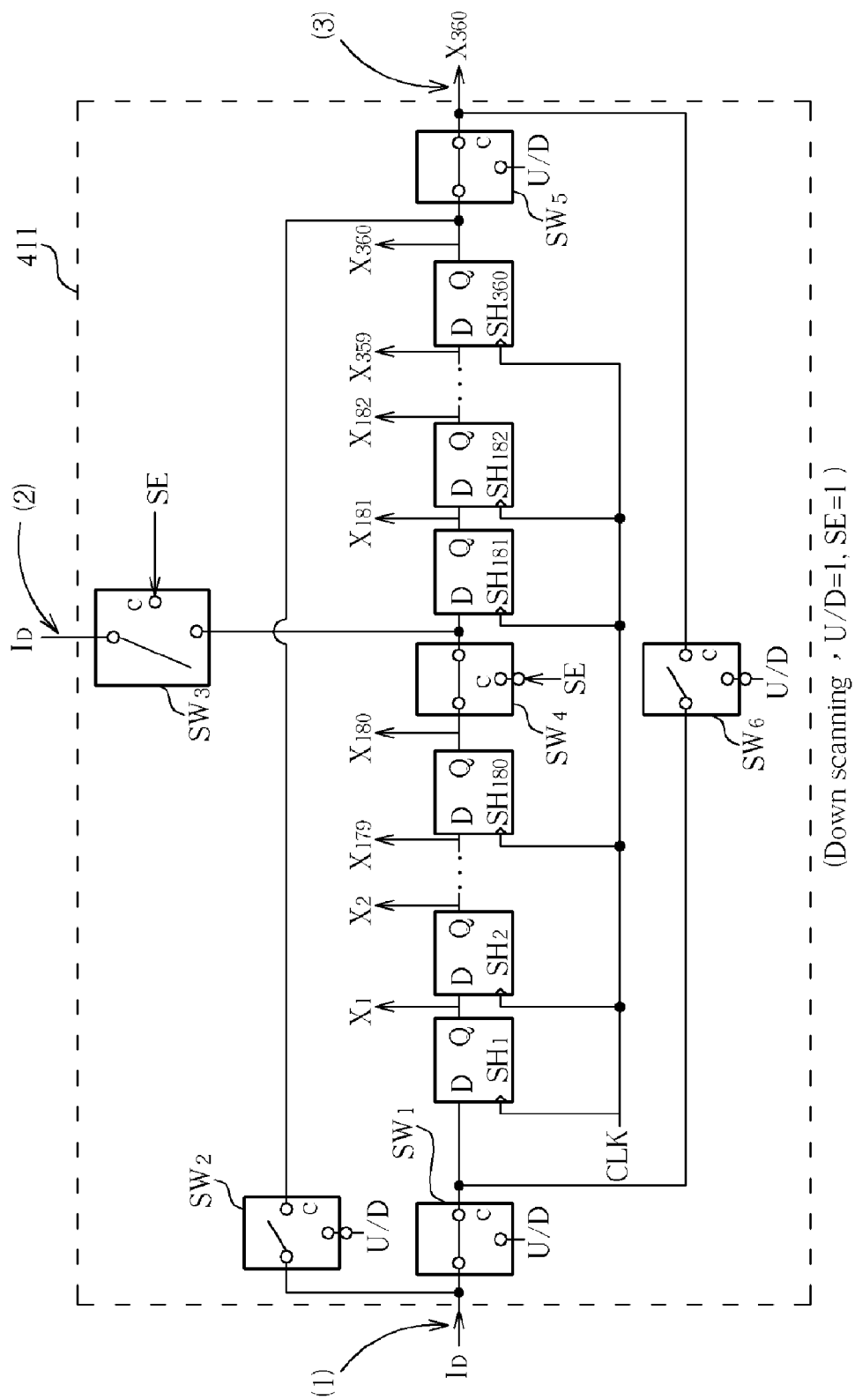
FIGS. 6, 7, and 8 are diagrams respectively illustrating three different shift registers of the present invention when in the down-scanning state.
Figure 7:
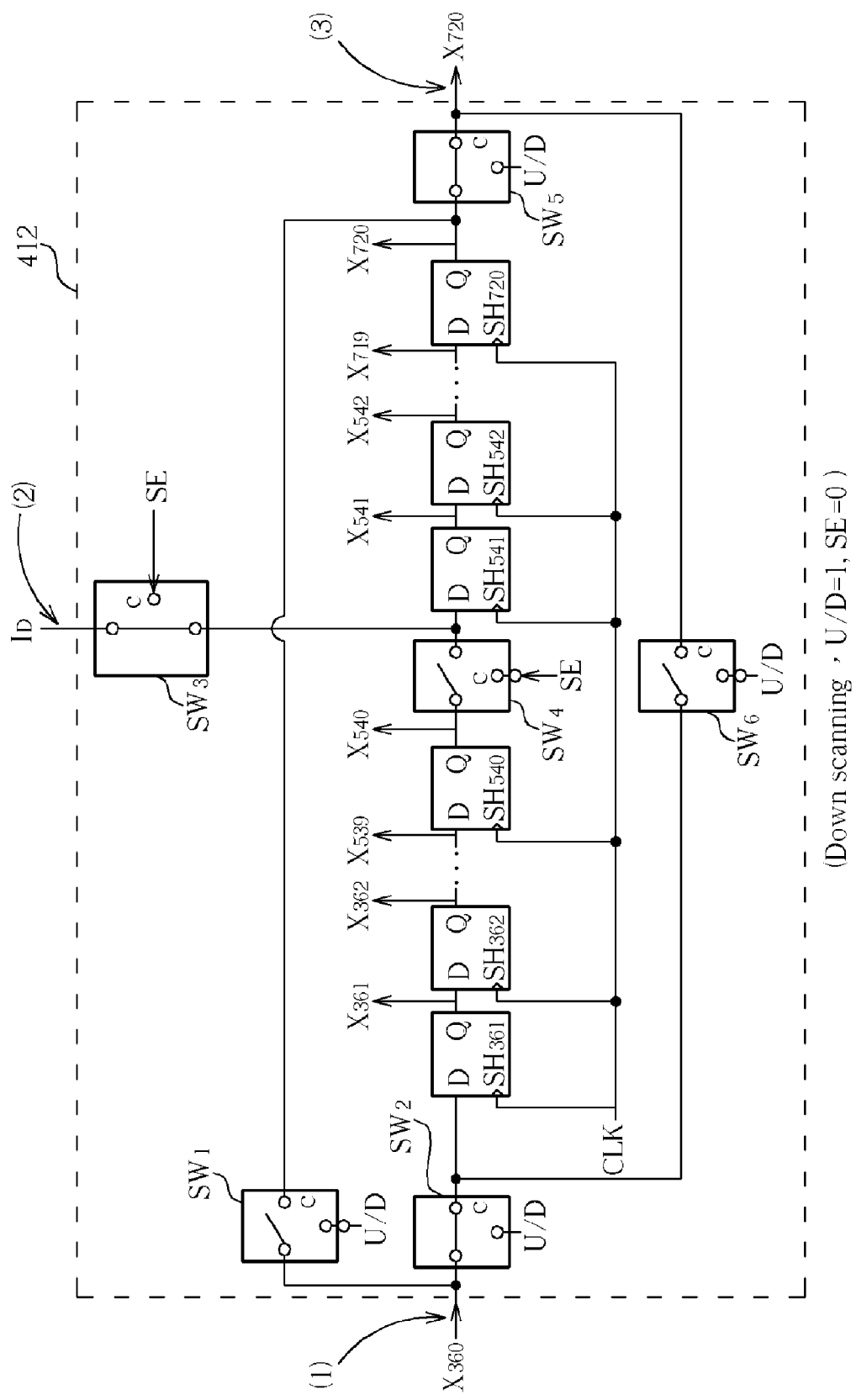
Figure 8:
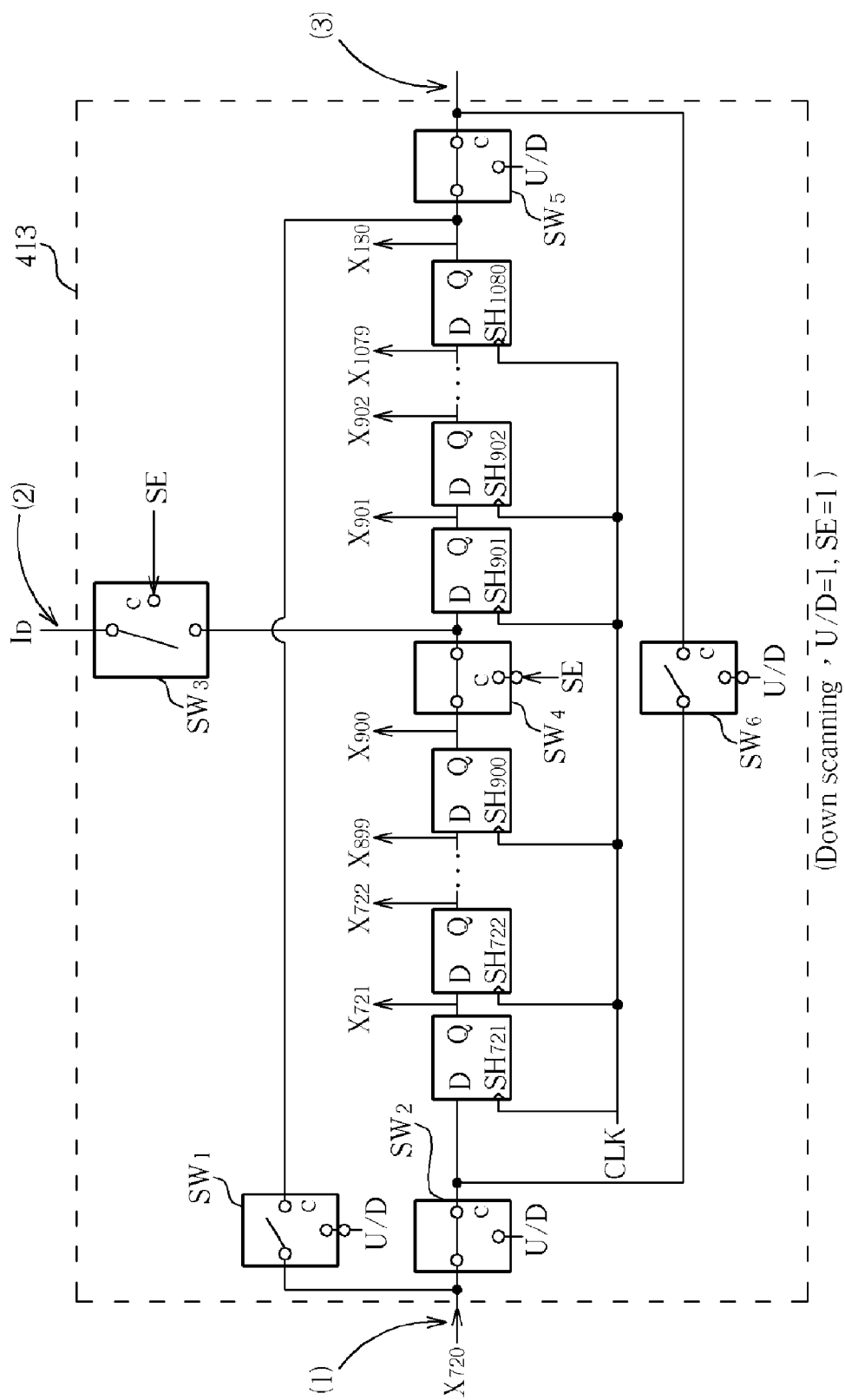

FIGS. 6, 7, and 8 are diagrams respectively illustrating the shift registers 411, 412, and 413 when in the down-scanning state.

In FIG. 6, the direction signal U/D is set to be logic "1" (high voltage level) because of the down-scanning state, and the selection signal $SE_1$ is set to be logic "1" (high voltage level) because the shift register 411 does not cross the upper and the lower display areas. As shown in FIG. 6, the transmission ends 1 and 2 of the shift register 411 receive the down-scanning enabling signal $I_D$, and the transmission end 3 transmits the driving signal $X_{360}$ to the shift register 412. The switch $SW_2$ couples the transmission end 1 to the first input end of the shift register unit $SH_1$ so the shift register unit $SH_1$ receives the down-scanning enabling signal $I_D$. The switch $SW_4$ couples the output end of the shift register unit $SH_{180}$ to the first input end of the shift register unit $SH_{181}$ so the driving signal $X_{180}$ is transmitted to the shift register unit $SH_{181}$. The switch $SW_5$ couples the output end of the shift register unit $SH_{360}$ to the transmission end 3 so the driving signal $X_{360}$ is transmitted to the shift register 412. The switch $SW_1$ cuts off the connection between the output end of the shift register unit $SH_{360}$ and the transmission end 1 so the output of the shift register unit $SH_{360}$ ($X_{360}$) is not transmitted to the transmission end 1. The switch $SW_3$ cuts off the connection between the transmission end 2 and the first input end of the shift register unit $SH_{181}$ so the first input end of the shift register unit $SH_{181}$ receives the driving signal $X_{180}$ of the shift register unit $SH_{180}$ instead of the down-scanning enabling signal $I_D$. The switch $SW_6$ cuts off the connection between the transmission ends 1 and 3 so the output driving signal $X_{360}$ of the shift register unit $SH_{360}$ is not transmitted to the transmission end 1, causing wrong operations.

In FIG. 7, the direction signal U/D is set to be logic "1" (high voltage level) because of the down-scanning state, and the selection signal $SE_2$ is set to be logic "0" (low voltage level) because the shift register 412 crosses the upper and the lower display areas. As shown in FIG. 7, the transmission end 1 of the shift register 412 receives the driving signal $X_{360}$, the transmission end 2 of the shift register 412 receives the down-scanning enabling signal $I_D$, and the transmission end 3 transmits the driving signal $X_{720}$ to the shift register 413. The switch $SW_2$ couples the transmission end 1 to the first input end of the shift register unit $SH_{361}$ so the shift register unit $SH_{361}$ receives the driving signal $X_{360}$. The switch $SW_3$ couples the transmission end 2 and the first input end of the shift register unit $SH_{541}$ so the first input end of the shift register unit $SH_{541}$ receives the down-scanning enabling signal $I_D$ instead of the driving signal $X_{540}$ of the shift register unit $SH_{540}$. The switch $SW_5$ couples the output end of the shift register unit $SH_{720}$ to the transmission end 3 so the driving signal $X_{720}$ is transmitted to the shift register 413. The switch $SW_1$ cuts off the connection between the output end of the shift register unit $SH_{720}$ and the transmission end 1 so the output of the shift register unit $SH_{720}$ ($X_{720}$) is not transmitted to the transmission end 1. The switch $SW_4$ cuts off the connection between the output end of the shift register unit $SH_{540}$ and the first input end of the shift register unit $SH_{541}$ so the first input end of the shift register unit $SH_{541}$ does not receive the driving signal $X_{540}$. The switch $SW_6$ cuts off the connection between the transmission ends 1 and 3 so the output driving signal $X_{720}$ of the shift register unit $SH_{720}$ is not transmitted to the transmission end 1, causing wrong operations.

In FIG. 8, the direction signal U/D is set to be logic "1" (high voltage level) because of the down-scanning state, and the selection signal $SE_3$ is set to be logic "1" (high voltage level) because the shift register 413 does not cross the upper and the lower display areas. As shown in FIG. 8, the transmission end 1 of the shift register 413 receives the driving signal $X_{720}$, and the transmission end 2 of the shift register 413 receives the down-scanning enabling signal $I_D$. The switch $SW_2$ couples the transmission end 1 to the first input end of the shift register unit $SH_{721}$ so the shift register unit $SH_{721}$ receives the driving signal $X_{720}$. The switch $SW_4$ couples the output end of the shift register unit $SH_{900}$ to the first input end of the shift register unit $SH_{901}$ so the driving signal $X_{900}$ is transmitted to the shift register unit $SH_{901}$. The switch $SW_5$ couples the output end of the shift register unit $SH_{1080}$ to the transmission end 3. The switch $SW_1$ cuts off the connection between the output end of the shift register unit $SH_{1080}$ and the transmission end 1 so the output of the shift register unit $SH_{1080}$ ($X_{1080}$) is not transmitted to the transmission end 1. The switch $SW_3$ cuts off the connection between the transmission end 2 and the first input end of the shift register unit $SH_{901}$ so the first input end of the shift register unit $SH_{901}$ receives the driving signal $X_{900}$ of the shift register unit $SH_{900}$ instead of the down-scanning enabling signal $I_D$. The switch $SW_6$ cuts off the connection between the transmission ends 1 and 3 so the output driving signal $X_{1080}$ of the shift register unit $SH_{1080}$ is not transmitted to the transmission end 1, causing wrong operations.

Figure 9:
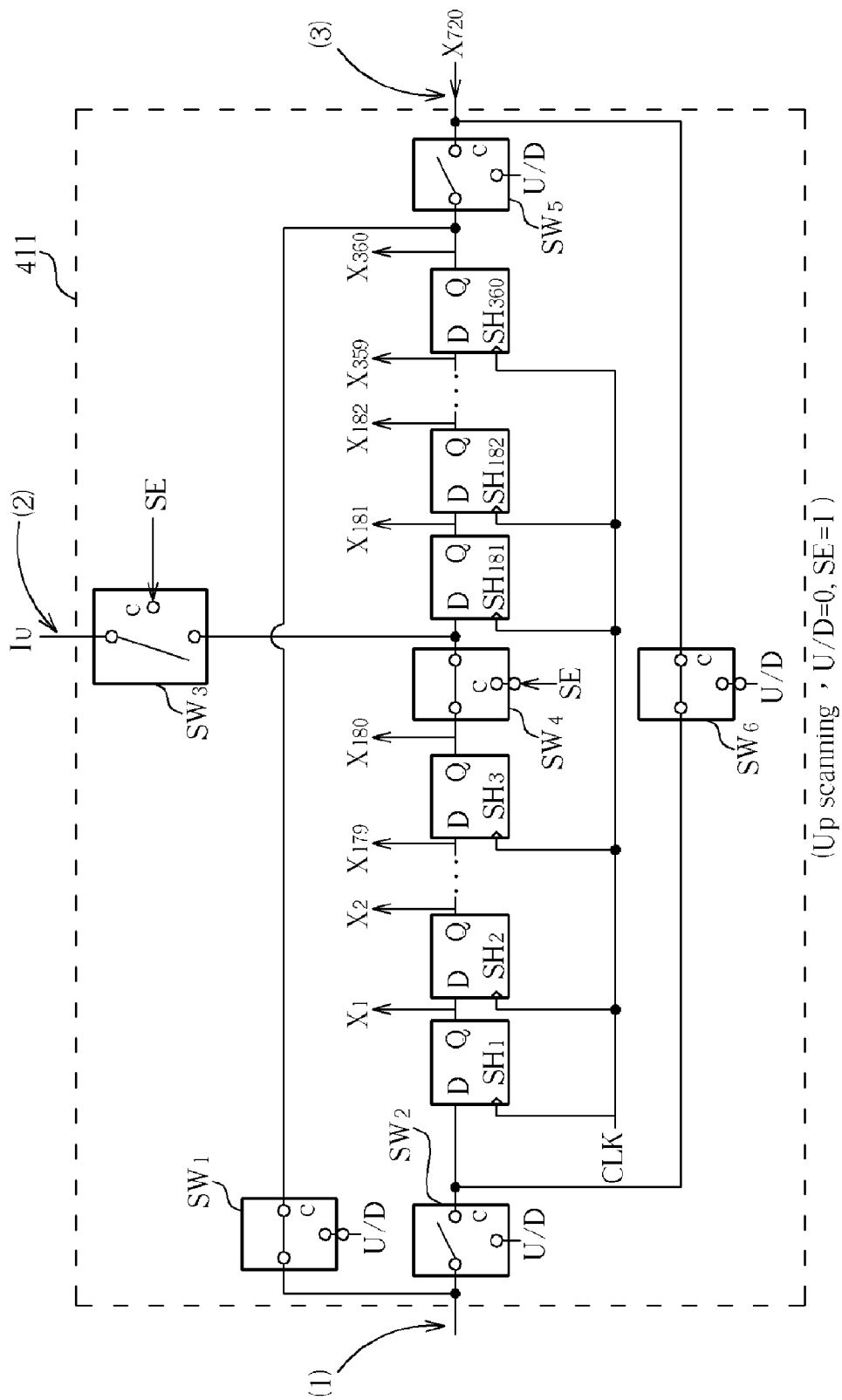
FIGS. 9, 10, and 11 are diagrams respectively illustrating three different shift registers of the present invention in the up-scanning state.
Figure 10:
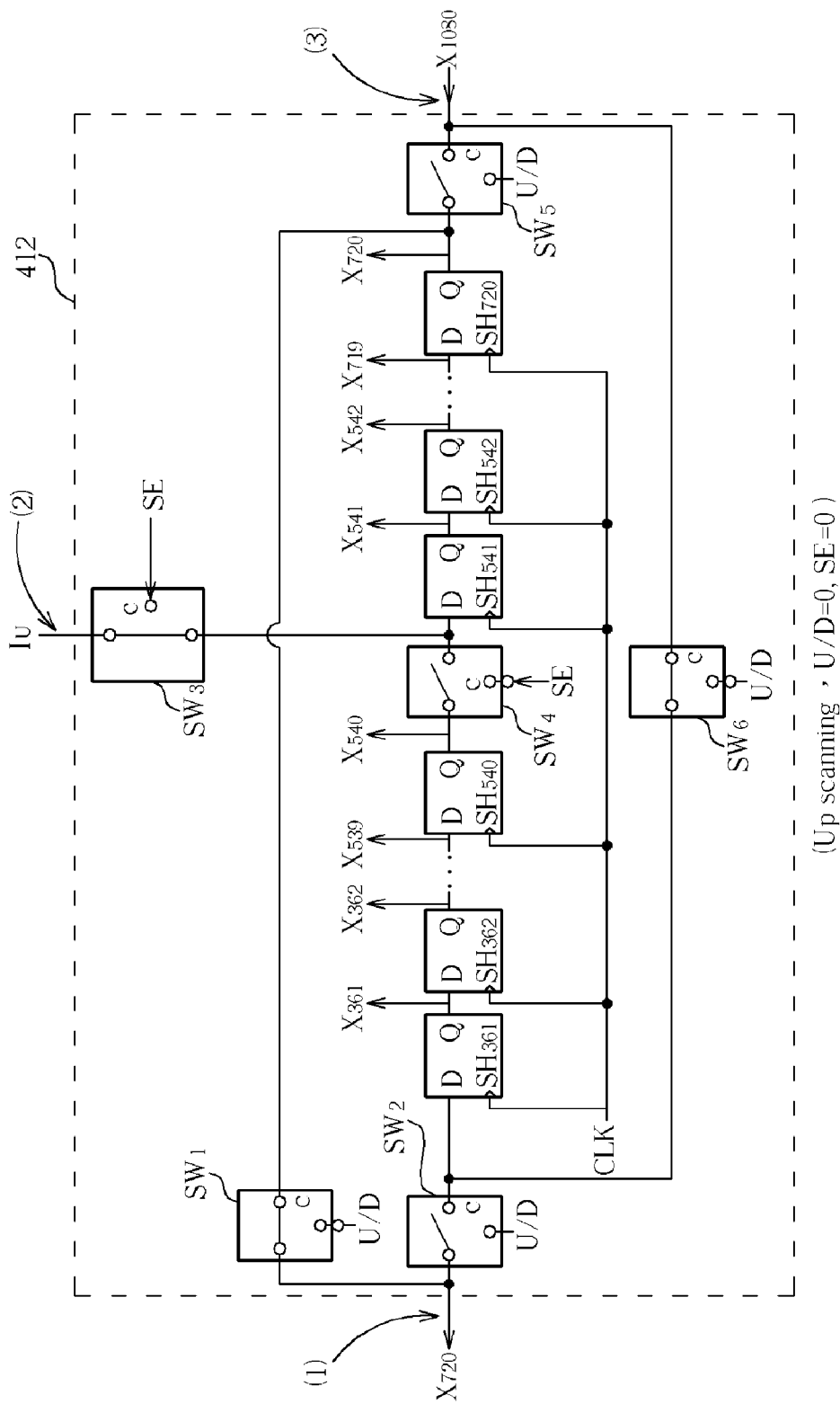
Figure 11:
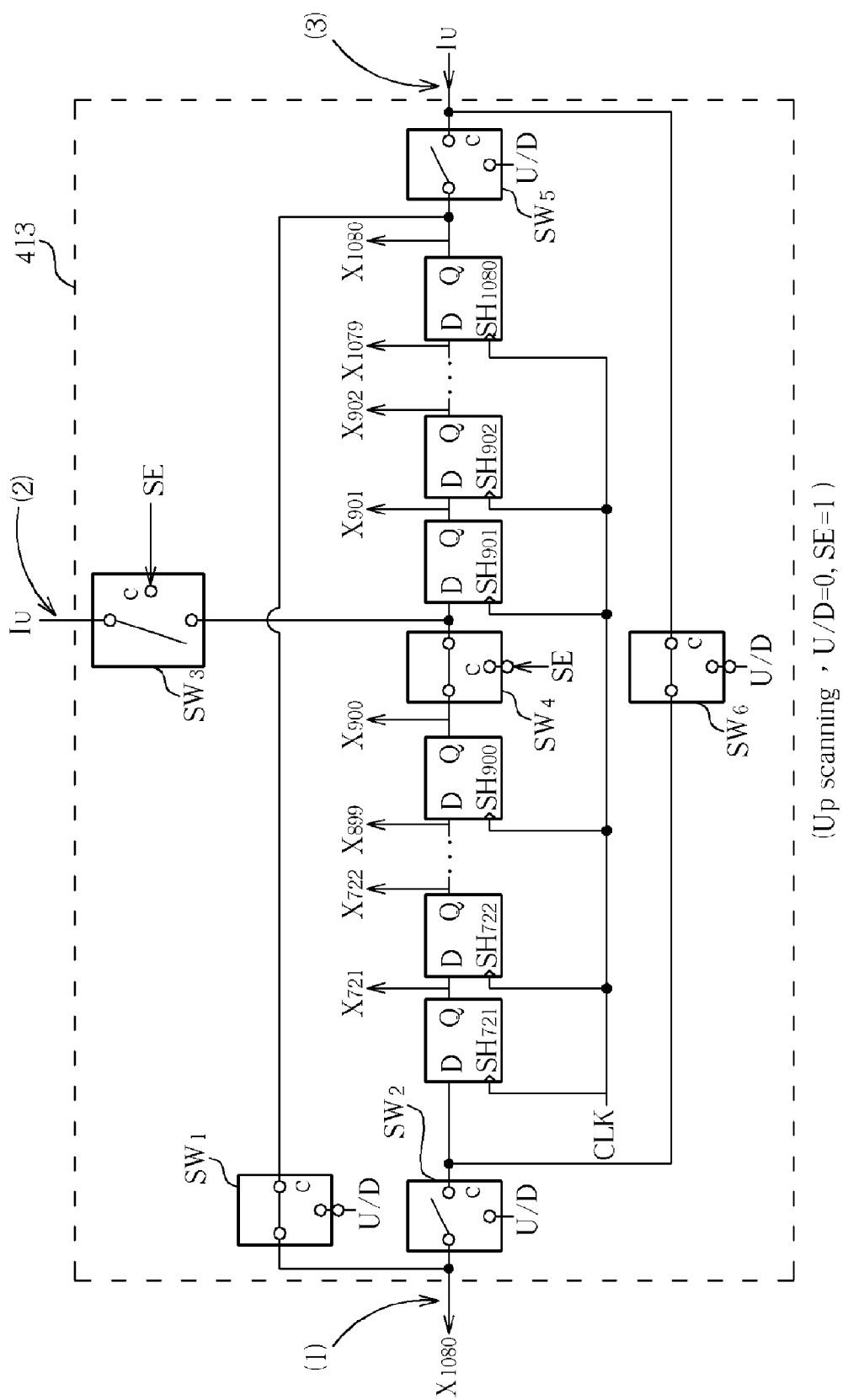

FIGS. 9, 10, and 11 are diagrams respectively illustrating the shift registers 411, 412, and 413 in the up-scanning state.

In FIG. 9, the direction signal U/D is set to be logic "0" (low voltage level) because of the up-scanning state, and the selection signal $SE_1$ is set to be logic "1" because the shift register 411 does not cross the upper and the lower display areas. As shown in FIG. 9, the transmission end 2 of the shift register 411 receives the up-scanning enabling signal $I_U$, and the transmission end 3 of the shift register 411 receives the driving signal $X_{720}$ from the shift register 412. The switch $SW_2$ cuts off the connection between the transmission end 1 and the first input end of the shift register unit $SH_1$. The switch $SW_6$ couples the first input end of the shift register unit $SH_1$ and the transmission end 3 so the driving signal $X_{720}$ is transmitted to the shift register unit $SH_1$. The switch $SW_4$ couples the output end of the shift register unit $SH_{180}$ to the first input end of the shift register unit $SH_{181}$ so the driving signal $X_{180}$ is transmitted to the shift register unit $SH_{181}$. The switch $SW_5$ cuts off the connection between the output end of the shift register unit $SH_{720}$ and the transmission end 3 and the switch $SW_1$ couples the output end of the shift register unit $SH_{720}$ to the transmission end 1 so the driving signal $X_{720}$ is transmitted to the transmission end 1. The switch $SW_3$ cuts off the connection between the transmission end 2 and the first input end of the shift register unit $SH_{181}$ so the shift register unit $SH_{181}$ does not receive the up-scanning enabling signal $I_U$.

In FIG. 10, the direction signal U/D is set to be logic "0" (low voltage level) because of the up-scanning state, and the selection signal $SE_2$ is set to be logic "0" (low voltage level) because the shift register 412 crosses the upper and the lower display areas. As shown in FIG. 10, the transmission end 2 receives the up-scanning enabling signal $I_U$, and the transmission end 3 receives the driving signal $X_{1080}$ from the shift register 413. The switch $SW_2$ cuts off the connection between the transmission end 1 and the first input end of the shift register unit $SH_{361}$, and the switch $SW_6$ couples the first end of the shift register unit $SH_{361}$ to the transmission end 3 so the driving signal $X_{1080}$ from the shift register 413 is transmitted to the shift register unit $SH_{361}$. The switch $SW_4$ cuts off the connection between the output end of the shift register unit $SH_{540}$ and the first input end of the shift register unit 541, and the switch $SW_3$ couples the transmission end 2 and the first input end of the shift register unit 541 so the up-scanning enabling signal $I_U$ is transmitted to the shift register unit 541. The switch $SW_5$ cuts off the connection between the output end of the shift register unit $SH_{720}$ and the transmission end 3, and the switch $SW_1$ couples the output end of the shift register unit $SH_{720}$ to the transmission end 1 so the driving signal $X_{720}$ is transmitted to the transmission end 1. The switch $SW_3$ couples the transmission end 2 and the first input end of the shift register unit $SH_{541}$, and the switch $SW_4$ cuts off the connection between the output end of the shift register unit 540 so the shift register unit 541 receives the up-scanning signal $I_U$ instead of the driving signal $X_{540}$.

In FIG. 11, the direction signal U/D is set to be logic "0" (low voltage level) because of the up-scanning state, and the selection signal $SE_3$ is set to be logic "1" because the shift register 413 does not cross the upper and the lower display areas. As shown in FIG. 11, the transmission ends 2 and 3 of the shift register 413 receives the up-scanning enabling signal $I_U$. The switch $SW_2$ cuts off the connection between the transmission end 1 and the first input end of the shift register unit $SH_{721}$ and the switch $SW_6$ couples the first input end of the shift register unit $SH_{721}$ and the transmission end 3 so the up scanning enabling signal $I_U$ is transmitted to the shift register unit $SH_{721}$. The switch $SW_4$ couples the output end of the shift register unit $SH_{900}$ to the first input end of the shift register unit $SH_{901}$ so the driving signal $X_{900}$ is transmitted to the shift register unit $SH_{901}$. The switch $SW_5$ cuts off the connection between the output end of the shift register unit $SH_{1080}$ and the transmission end 3 and the switch $SW_1$ couples the output end of the shift register unit $SH_{1080}$ to the transmission end 1 so the driving signal $X_{1080}$ is transmitted to the transmission end 1. The switch $SW_3$ cuts off the connection between the transmission end 2 and the first input end of the shift register unit $SH_{901}$ so the shift register unit $SH_{901}$ does not receive the up-scanning enabling signal $I_U$.

Figure 12:
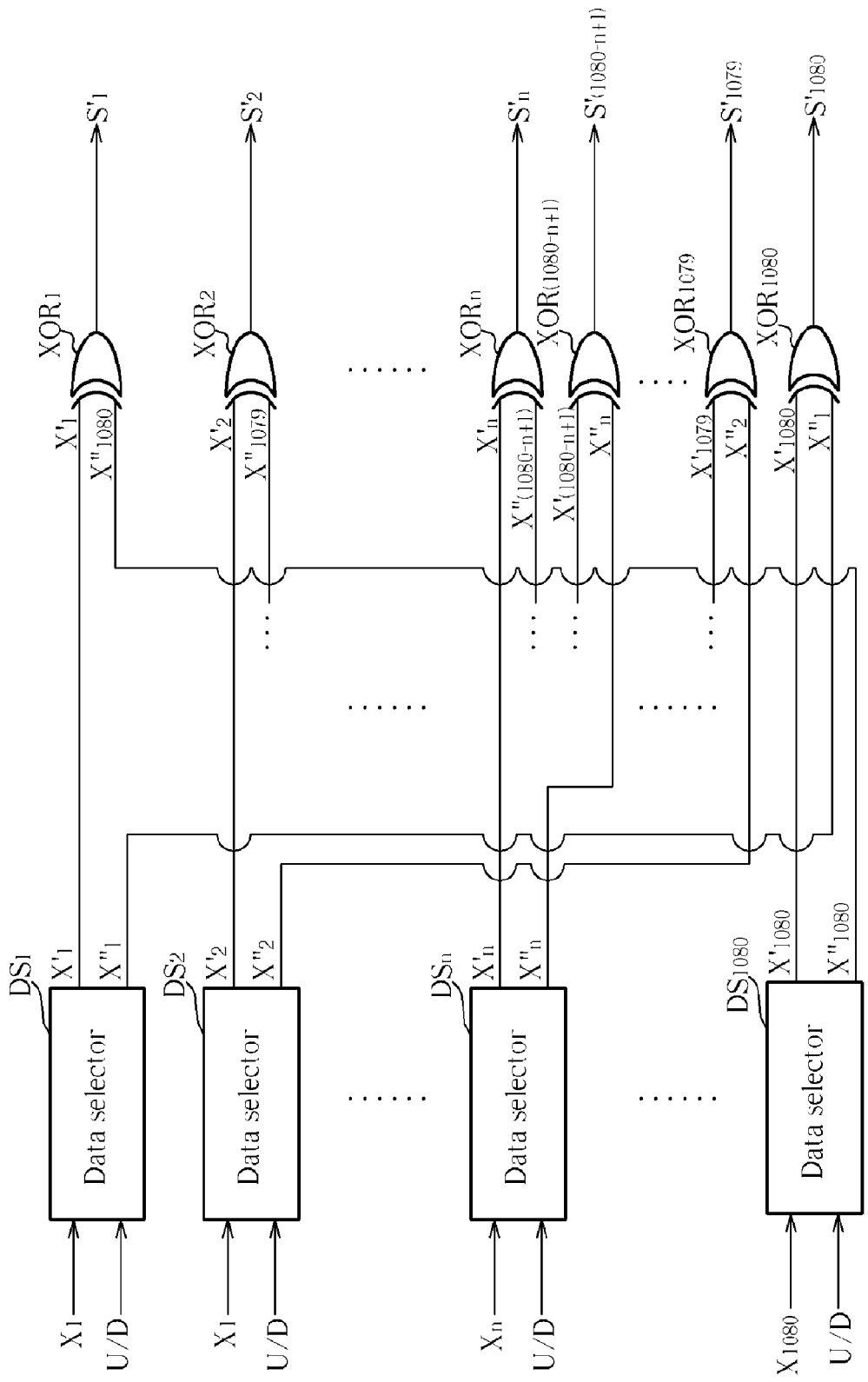
FIG. 12 is a diagram illustrating the data selection circuit of the present invention.
Figure 13:
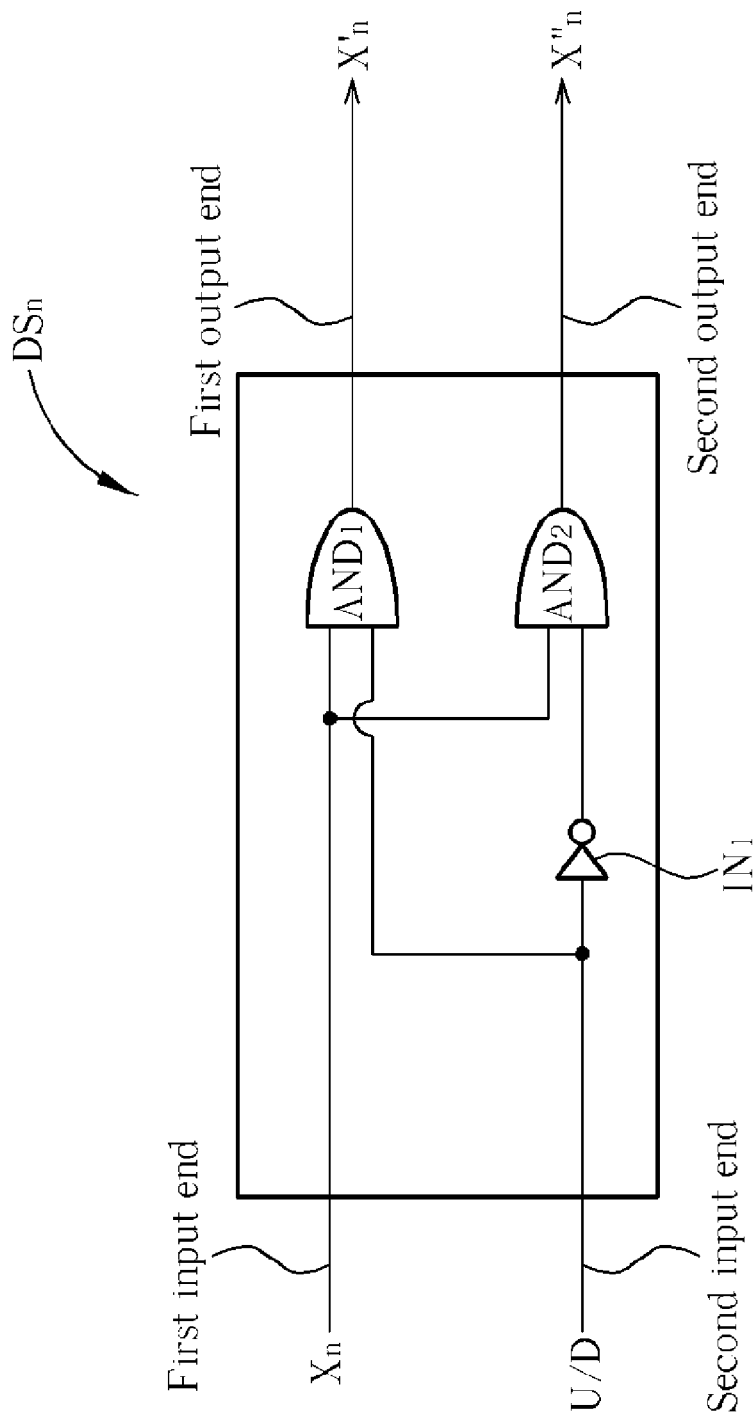
FIG. 13 is a diagram illustrating data selector in the data selection circuit of the present invention.

FIG. 12 is a diagram illustrating the data selection circuit 440. FIG. 13 is a diagram illustrating data selector $DS_n$ in the data selection circuit 440. As shown in FIG. 12, the data selection circuit 440 comprises 1080 data selectors $DS_1 \sim DS_n$ and 1080 exclusive OR gates (XOR) $XOR_1 \sim XOR_{1080}$. The data selectors $DS_1 \sim DS_n$ receive corresponding driving signals and the direction signal U/D, and transmit output signals according to the direction signal U/D. For example, the data selector $DS_1$ receives the driving signal $X_1$ and the direction signal U/D, and outputs the driving signals $X_1'$ or $X_1''$ according to the direction signal U/D, the data selector $DS_2$ receives the driving signal $X_2$ and the direction signal U/D, and outputs the driving signals $X_2'$ or $X_2''$ according to the direction signal U/D, and the data selector $DS_n$ receives the driving signal $X_n$ and the direction signal U/D, and outputs the driving signals $X_n'$ or $X_n''$ according to the direction signal U/D, and so on.

In FIG. 13, the data selector $DS_n$ comprises a first input end, a second input end, a first output end, a second output end, two AND gates $AND_1$ and $AND_2$, and an inverter $IN_1$. The first input end of the data selector $DS_n$ receives the corresponding driving signal $X_n$, the second input end of the data selector $DS_n$ receives the direction signal U/D, the first output end of the data selector $DS_n$ outputs the driving signal $X_n'$, and the second output end of the data selector $DS_n$ outputs the driving signal $X_n''$. One input end of the AND gate $AND_1$ is coupled to the first input end of the data selector $DS_n$ for receiving the driving signal $X_n$, the other input end of the AND gate $AND_1$ is coupled to the second input end of the data selector $DS_n$ for receiving the direction signal U/D, the output end of the AND gate $AND_1$ outputs the driving signal $X_n'$ according to the calculation result of the received signals on the two input ends of the AND gate $AND_1$. The inverter $IN_1$ is coupled between the second input end of the data selector $DS_n$ and one input end of the AND gate $AND_2$ for inverting the direction signal U/D and transmitting the inverted direction signal U/D to the AND gate $AND_2$. The other input end of the AND gate $AND_2$ is coupled to the first input end of the data selector $DS_n$ for receiving the driving signal $X_n$. The output end of the AND gate $AND_2$ outputs the driving signal $X_n''$ according to the calculation result of the received signals on the two input ends of the AND gates $AND_1$ and $AND_2$. When the direction signal U/D is set to be logic "0" (up-scanning), the data selector $DS_n$ outputs the driving signal $X_n$ as the driving signal $X_n''$. When the direction signal U/D is set to be logic "1" (down-scanning), the data selector $DS_n$ outputs the driving signal $X_n$ as the driving signal $X_n'$.

As shown in FIG. 12, the first output end of the data selector $DS_1$ (for outputting the driving signal $X_1'$) is coupled to one input end of the exclusive OR gate $XOR_1$, and the second output end of the data selector $DS_1$ (for outputting the driving signal $X_1''$) is coupled to one input end of the exclusive OR gate $XOR_{1080}$. The first output end of the data selector $DS_2$ (for outputting the driving signal $X_2'$) is coupled to one input end of the exclusive OR gate $XOR_2$, and the second output end of the data selector $DS_2$ (for outputting the driving signal $X_2''$) is coupled to one input end of the exclusive OR gate $XOR_{1079}$. The first output end of the data selector $DS_n$ (for outputting the driving signal $X_n'$) is coupled to one input end of the exclusive OR gate $XOR_n$, and the second output end of the data selector $DS_n$ (for outputting the driving signal $X_n''$) is coupled to one input end of the exclusive OR gate $XOR_{(1080-n+1)}$. The first output end of the data selector $DS_{1080}$ (for outputting the driving signal $X_{1080}'$) is coupled to one input end of the exclusive OR gate $XOR_{1080}$, and the second output end of the data selector $DS_{1080}$ (for outputting the driving signal $X_{1080}''$) is coupled to one input end of the exclusive OR gate $XOR_1$. In this way, the data selection circuit 440 transmits driving signals $S_1', S_2' \ldots S_{1080}'$ according to the direction signal U/D.

Figure 14:
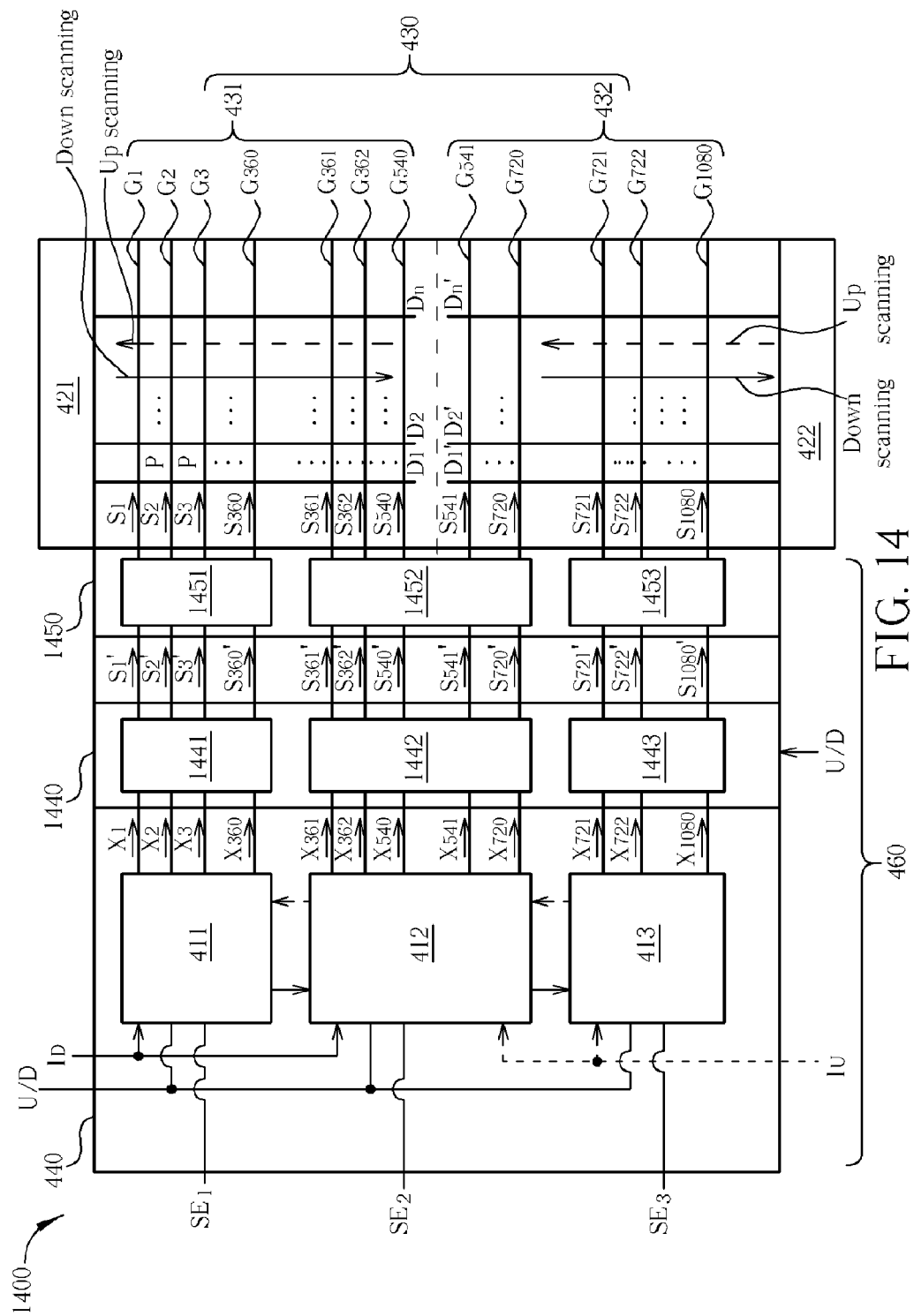
FIG. 14 is a diagram illustrating an LCD with double frame rate of another embodiment of the present invention.

FIG. 14 is a diagram illustrating an LCD 1400 with double frame rate of another embodiment of the present invention. As shown in FIG. 14, the LCD 1400 is similar to the LCD 400. The difference between the LCD 400 and the LCD 1400 is the signal selection circuit 1440 and the voltage shift circuit 1450. As shown in FIG. 14, the signal selection circuit 1440 comprises 3 sub-signal selection circuits 1441, 1442, and 1443, and the voltage shift circuit 1450 comprises 3 sub-voltage shift circuits 1451, 1452, and 1453. The sub-signal selection circuits 1441~1443 are respectively disposed for the signals X1 to X360, X361 to X720, and X721 to X1080. In this way, the sub-signal selection circuits 1441~1443 are easier to manufacture than the signal selection circuit 440. The sub-voltage shift circuits 1451~1453 are respectively disposed for the signals S1' to S360', S361' to S720', and S721' to S1080'. In this way, the sub-voltage shift circuits 1451~1453 are easier to manufacture than the signal selection circuit 450.

Figure 15:
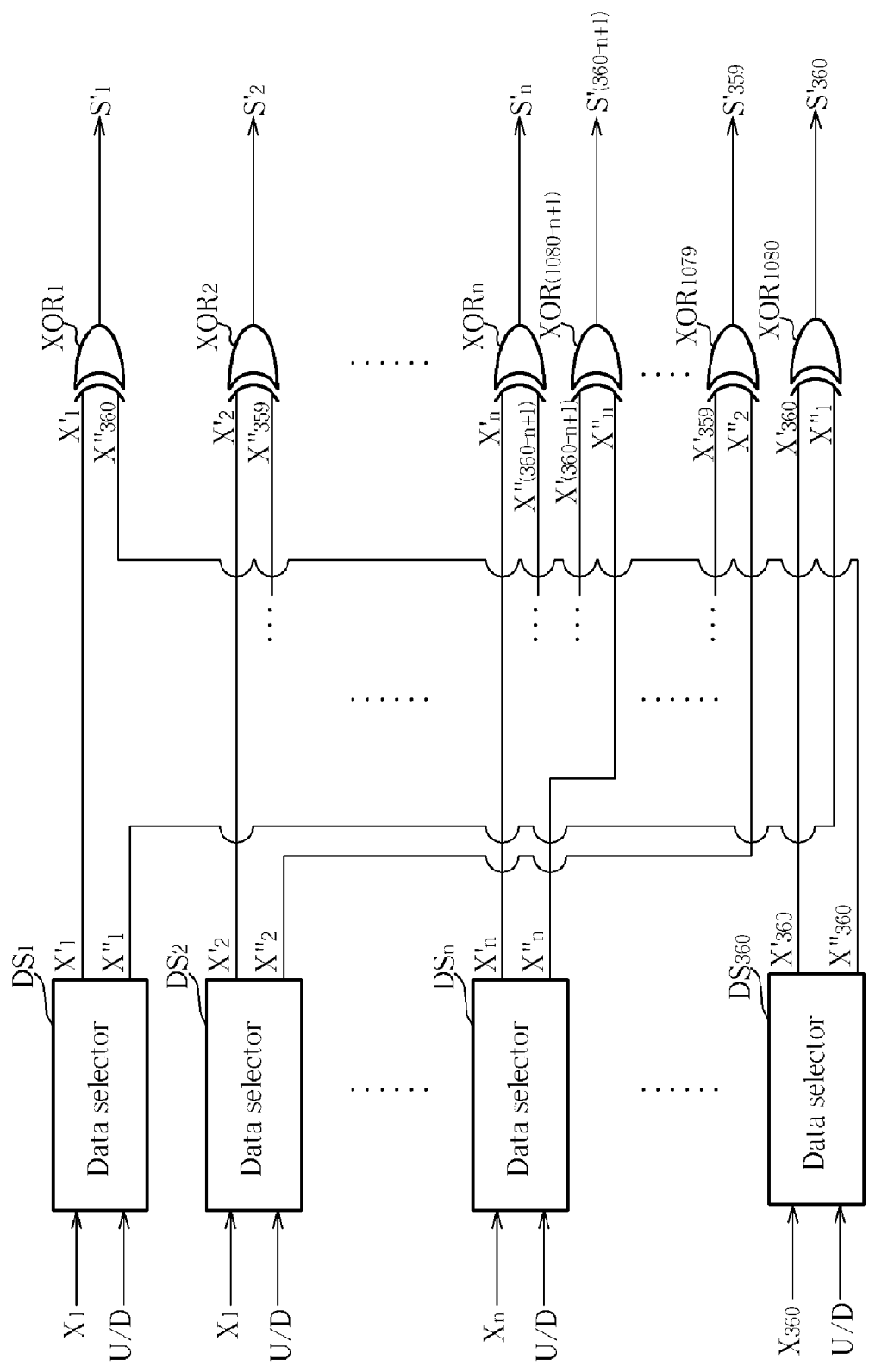
FIG. 15 is a diagram illustrating the sub-data selection circuit in FIG. 14.

FIG. 15 is a diagram illustrating the sub-data selection circuit in FIG. 14. As shown in FIG. 15, the sub-data selection circuit (for example, sub-data selection circuit 1441, 1442, or 1443) comprises 360 data selectors DS1~DSn and 360 exclusive OR gates (XOR) XOR1~XOR360. The only difference between the data selection circuit 440 and the sub-data selection circuit 1441, 1442, or 1443 is the number of data selectors and the exclusive gates of the sub-data selection circuit 1441, 1442, or 1443 is 360 instead of 1080 of the data selection circuit 440.

Additionally, the voltage shift circuit 450 shifts the voltages of the received driving signals and transmits the shifted driving signals as the gate driving signals. For example, all driving signals $S_1' \sim S_{1080}'$ are shifted by 1 volt to be gate driving signals $S_1 \sim S_{1080}$. That is, if the driving signal $S_1'$ is 5 volts, then the voltage shift circuit 450 shifts the driving signal $S_1'$ by 1 volt, and the gate driving signal $S_1$ is 6 volt.

Furthermore, the disposition of the gate driving circuit of the present invention is only an exemplification; the gate driving circuit can also be disposed at both sides of the LCD to increase the driving ability of the driving signals.

Therefore, the shift register and the related gate driving circuit of the present invention efficiently reduce the amount of the gate drivers and also have bi-direction transmission function, which reduces fabrication cost and increases convenience.

Those skilled in the art will readily observe that numerous modifications and alterations of the device and method may be made.

What is claimed is:

1. A shift register comprising:
a first transmission end for receiving a down-scanning enabling signal;
a second transmission end for receiving the down-scanning enabling signal or an up-scanning enabling signal;
a third transmission end for receiving the up-scanning enabling signal;
a first switch comprising:
a first end coupled to the first transmission end;
a control end for receiving a direction signal indicating the up-scanning or the down-scanning enabling signal is received; and
a second end for coupling to the first end of the first switch according to the direction signal;
a first shift register module having m shift register units comprising:
a first shift register unit comprising:
a first input end coupled to the second end of the first switch;
a second input end for receiving a clock signal; and
an output end for outputting a first driving signal according to the signals on the first input end and the second input end of the first shift register unit;
a $p^{th}$ shift register unit comprising:
a first input end coupled to an output end of a $(p-1)^{th}$ shift register unit;
a second input end for receiving the clock signal; and
an output end for outputting a $p^{th}$ driving signal according to the signals on the first input end and the second input end of the $p^{th}$ shift register unit; and
an $m^{th}$ shift register unit comprising:
a first input end coupled to an output end of an $(m-1)^{th}$ shift register unit;
a second input end for receiving the clock signal; and
an output end for outputting an $m^{th}$ driving signal according to the signals on the first input end and the second input end of the $m^{th}$ shift register unit;
a second switch comprising:
a first end coupled to the output end of the $m^{th}$ shift register unit;
a control end for receiving a selection signal; and
a second end for coupling to the first end of the second switch according to the selection signal;
a second shift register module having n shift register units comprising:
a second shift register unit comprising:
a first input end coupled to the second end of the first switch;
a second input end for receiving the clock signal; and
an output end for outputting a second driving signal according to the signals on the first input end and the second input end of the second shift register unit;
a $q^{th}$ shift register unit comprising:
a first input end coupled to an output end of a $(q-1)^{th}$ shift register unit;
a second input end for receiving the clock signal; and
an output end for outputting a $q^{th}$ driving signal according to the signals on the first input end and the second input end of the $q^{th}$ shift register unit; and
an $n^{th}$ shift register unit comprising:
a first input end coupled to an output end of an $(n-1)^{th}$ shift register unit;
a second input end for receiving the clock signal; and
an output end for outputting a $n^{th}$ driving signal according to the signals on the first input end and the second input end of the $n^{th}$ shift register unit;
a third switch comprising:
a first end coupled to the output end of the $n^{th}$ shift register;
a control end for receiving the direction signal; and
a second end coupled to the third transmission end of the shift register for coupling to the first end of the third switch according to the direction signal;
a fourth switch comprising:
a first end coupled to the output end of the $n^{th}$ shift register unit;
a control end for an inversion of the direction signal; and
a second end coupled to the first transmission end of the shift register for coupling to the first end of the fourth switch according to the inversion of the direction signal;
a fifth switch comprising:
a first end coupled to the second transmission end of the shift register;
a control end for receiving the inversion of the direction signal; and
a second end coupled to the first input end of the second shift register unit for coupling to the first end of the fifth switch according to the inversion of the direction signal; and
a sixth switch comprising:
a first end coupled to the output end of the $n^{th}$ shift register unit;
a control end for receiving the inversion of the direction signal; and
a second end coupled to the first input end of the first shift register unit for coupling to the first end of the sixth switch according to the inversion of the direction signal;
wherein m, n, p, q are integers greater than 1 and $1<p<m$, and $1<q<n$.

2. A gate driving circuit with bi-directional transmission function comprising:
a shift register comprising:
a first transmission end for receiving a down-scanning enabling signal;
a second transmission end for receiving the down-scanning enabling signal or an up-scanning enabling signal;
a third transmission end for receiving the up-scanning enabling signal;
a first switch comprising:
a first end coupled to the first transmission end;
a control end for receiving a direction signal indicating the up-scanning or the down-scanning enabling signal is received; and
a second end for coupling to the first end of the first switch according to the direction signal;

a first shift register module having m shift register units comprising:
  a first shift register unit comprising:
    a first input end coupled to the second end of the first switch;
    a second input end for receiving a clock signal; and
    an output end for outputting a first driving signal according to the signals on the first input end and the second input end of the first shift register unit;
  a $p^{th}$ shift register unit comprising:
    a first input end coupled to an output end of a $(p-1)^{th}$ shift register unit;
    a second input end for receiving the clock signal; and
    an output end for outputting a $p^{th}$ driving signal according to the signals on the first input end and the second input end of the $p^{th}$ shift register unit; and
  an $m^{th}$ shift register unit comprising:
    a first input end coupled to an output end of an $(m-1)^{th}$ shift register unit;
    a second input end for receiving the clock signal; and
    an output end for outputting an $m^{th}$ driving signal according to the signals on the first input end and the second input end of the $m^{th}$ shift register unit;
a second switch comprising:
  a first end coupled to the output end of the $m^{th}$ shift register unit;
  a control end for receiving a selection signal; and
  a second end for coupling to the first end of the second switch according to the selection signal;
a second shift register module having n shift register units comprising:
  a second shift register unit comprising:
    a first input end coupled to the second end of the first switch;
    a second input end for receiving the clock signal; and
    an output end for outputting a second driving signal according to the signals on the first input end and the second input end of the second shift register unit;
  a $q^{th}$ shift register unit comprising:
    a first input end coupled to an output end of a $(q-1)^{th}$ shift register unit;
    a second input end for receiving the clock signal; and
    an output end for outputting a $q^{th}$ driving signal according to the signals on the first input end and the second input end of the $q^{th}$ shift register unit; and
  an $n^{th}$ shift register unit comprising:
    a first input end coupled to an output end of an $(n-1)^{th}$ shift register unit;
    a second input end for receiving the clock signal; and
    an output end for outputting an $n^{th}$ driving signal according to the signals on the first input end and the second input end of the $n^{th}$ shift register unit;
a third switch comprising:
  a first end coupled to the output end of the $n^{th}$ shift register;
  a control end for receiving the direction signal; and
  a second end coupled to the third transmission end of the shift register for coupling to the first end of the third switch according to the direction signal;
a fourth switch comprising:
  a first end coupled to the output end of the $n^{th}$ shift register unit;
  a control end for receiving inversion of the direction signal; and
  a second end coupled to the first transmission end of the shift register for coupling to the first end of the fourth switch according to the inversion of the direction signal;
a fifth switch comprising:
  a first end coupled to the second transmission end of the shift register;
  a control end for receiving the inversion of the direction signal; and
  a second end coupled to the first input end of the second shift register unit for coupling to the first end of the fifth switch according to the inversion of the direction signal;
a sixth switch comprising:
  a first end coupled to the output end of the $n^{th}$ shift register unit;
  a control end for receiving the inversion of the direction signal; and
  a second end coupled to the first input end of the first shift register unit for coupling to the first end of the sixth switch according to the inversion of the direction signal; and
a data selection circuit coupled to the shift register for selectively and sequentially generating a plurality of gate driving signals according to driving signals generated by the shift register and the up-scanning enabling signal or the down-scanning enabling signal;
wherein m, n, p, q are integers greater than 1 and $1<p<m$, and $1<q<n$.

3. The gate driving circuit of claim 2, wherein the data selection circuit comprises:
  (m+n) data selectors, wherein the $b^{th}$ data selector comprises:
    a first AND gate comprising:
      a first input end coupled to the output end of the corresponding shift register unit;
      a second input end for receiving the direction signal; and
      an output end for outputting AND calculation result of the first and second input ends of the first AND gate;
    an inverter for receiving the direction signal and outputting inversion of the direction signal; and
    a second AND gate comprising:
      a first input end coupled to the output end of the corresponding shift register unit;
      a second input end coupled to the inverter for receiving the inversion of the direction signal; and
      an output end for outputting AND calculation result of the first and second input ends of the second AND gate; and
  (m+n) exclusive OR gates wherein the $k^{th}$ exclusive OR gate comprises:
    a first input end coupled to the output end of the first OR gate of the $k^{th}$ data selector;
    a second input end coupled to the output end of the second OR gate of the $(m+n-k+1)^{th}$ data selector; and
    an output end for outputting exclusive OR calculation result of the first input and second input ends of the $k^{th}$ exclusive OR gate as corresponding gate driving signal;

wherein m, n, b, k are integers greater than 1, and $1<b\leq(m+n)$, and $1<k\leq(m+n)$.

4. The gate driving circuit of claim 2 further comprising a voltage shift circuit for adjusting voltages of gate driving signals outputted from the data selection circuit.

5. An LCD with double frame rate comprising:
an upper display area comprising c gate lines;
a lower display area comprising d gate lines;
a gate driving circuit comprising:
a first shift register coupled to corresponding x lines of the upper display area for providing corresponding gate driving signals;
a second shift register coupled to corresponding y lines of the lower display area for providing corresponding gate driving signals; and
a third shift register coupled to corresponding (c-x) lines of the upper display area and corresponding (d-y) lines of the lower display area for providing corresponding gate driving signals;
wherein c, d, x, y are integers greater than 1, and $1<x<c$, and $1<y<d$;
wherein each shift register of the first, the second, and the third shift registers comprises:
a first transmission end for receiving a down-scanning enabling signal;
a second transmission end for receiving the down-scanning enabling signal or an up-scanning enabling signal;
a third transmission end for receiving the up-scanning enabling signal;
a first switch comprising:
a first end coupled to the first transmission end;
a control end for receiving a direction signal indicating the UP scanning or the down-scanning enabling signal is received; and
a second end for coupling to the first end of the first switch according to the direction signal;
a first shift register module having m shift register units comprising:
a first shift register unit comprising:
a first input end coupled to the second end of the first switch;
a second input end for receiving a clock signal; and
an output end for outputting a first driving signal according to the signals on the first input end and the second input end of the first shift register unit;
a $p^{th}$ shift register unit comprising:
a first input end coupled to an output end of a (p−1) shift register unit;
a second input end for receiving the clock signal; and
an output end for outputting a $p^{th}$ driving signal according to the signals on the first input end and the second input end of the $p^{th}$ shift register unit; and
an $m^{th}$ shift register unit comprising:
a first input end coupled to an output end of an $(m-1)^{th}$ shift register unit;
a second input end for receiving the clock signal; and
an output end for outputting an $m^{th}$ driving signal according to the signals on the first input end and the second input end of the $m^{th}$ shift register unit;
a second switch comprising:
a first end coupled to the output end of the $m^{th}$ shift register unit;
a control end for receiving a selection signal;
and a second end for coupling to the first end of the second switch according to the selection signal;
a second shift register module having n shift register units comprising:
a second shift register unit comprising:
a first input end coupled to the second end of the first switch;
a second input end for receiving the clock signal; and
an output end for outputting a second driving signal according to the signals on the first input end and the second input end of the second shift register unit;
a $q^{th}$ shift register unit comprising:
a first input end coupled to an output end of a $(q-1)^{th}$ shift register unit;
a second input end for receiving the clock signal; and
an output end for outputting a $q^{th}$ driving signal according to the signals on the first input end and the second input end of the $q^{th}$ shift register unit; and
an $n^{th}$ shift register unit comprising:
a first input end coupled to an output end of an $(n-1)^{th}$ shift register unit;
a second input end for receiving the clock signal; and
an output end for outputting an $n^{th}$ driving signal according to the signals on the first input end and the second input end of the $n^{th}$ shift register unit;
a third switch comprising:
a first end coupled to the output end of the $n^{th}$ shift register;
a control end for receiving the direction signal; and a second end coupled to the third transmission end of the shift register for coupling to the first end of the third switch according to the direction signal;
a fourth switch comprising:
first end coupled to the output end of the $n^{th}$ shift register unit;
a control end for receiving inversion of the direction signal; and
a second end coupled to the first transmission end of the shift register for coupling to the first end of the fourth switch according to the inversion of the direction signal;
a fifth switch comprising:
a first end coupled to the second transmission end of the shift register;
a control end for receiving the inversion of the direction signal; and
a second end coupled to the first input end of the second shift register unit for coupling to the first end of the fifth switch according to the inversion of the direction signal; and
a sixth switch comprising:
a first end coupled to the output end of the $n^{th}$ shift register unit;
a control end for receiving the inversion of the direction signal; and a second end coupled to the first input end of the first shift register unit for coupling to the first end of the sixth switch according to the inversion of the direction signal;

wherein m, n, p, q are integers greater than 1 and 1<p<m, and 1<q<n.

6. The LCD of claim 5 further comprising a data selection circuit coupled to the first, second, and third shift registers for selectively and sequentially generating plurality of gate driving signals according to the driving signals of the first, second, and the third shift registers and the up-scanning enabling signal or the down-scanning enabling signal.

7. The LCD of claim 6, wherein the data selection circuit comprises:

(c+d) data selectors, wherein the $b^{th}$ data selector comprises:

a first AND gate comprising:

a first input end coupled to the output end of the corresponding shift register unit;

a second input end for receiving the direction signal; and an output end for outputting AND calculation result of the first and second input ends of the first or gate;

an inverter for receiving the direction signal and outputting inversion of the direction signal; and a second AND gate comprising:

a first input end coupled to the output end of the corresponding shift register unit;

a second input end coupled to the inverter for receiving the inversion of the direction signal; and an output end for outputting AND calculation result of the first and second input ends of the second or gate; and (c+d) exclusive OR gates wherein the $k^{th}$ exclusive OR gate comprises:

a first input end coupled to the output end of the first OR gate of the $k^{th}$ data selector;

a second input end coupled to the output end of the second OR gate of the $(c+d-k+1)^{th}$ data selector; and an output end for outputting exclusive OR calculation result of the first input and second input ends of the $k^{th}$ exclusive OR gate as corresponding gate driving signal;

wherein c, d, b, k are integers greater than 1, and 1<b≦(c+d), and 1<k≦(c+d).

8. The LCD of claim 6 further comprising a voltage shift circuit for adjusting voltages of gate driving signals outputted from the data selection circuit.

9. The LCD of claim 5 further comprising a data driving circuit coupled to the upper display area for outputting frame data to the upper display area.

10. The LCD of claim 5 further comprising a data driving circuit coupled to the lower display area for outputting frame data to the lower display area.

* * * * *